(12) United States Patent  
Iwanami et al.

(10) Patent No.: US 9,813,010 B2  
(45) Date of Patent: Nov. 7, 2017

(54) MOTOR CONTROL APPARATUS HAVING A FUNCTION OF DETECTING MISWIRING

(71) Applicant: FANUC CORPORATION, Yamanashi (JP)

(72) Inventors: Shunsuke Iwanami, Yamanashi (JP); Akira Yamaguchi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/043,719

(22) Filed: Feb. 15, 2016

(65) Prior Publication Data

US 2016/0241184 A1 Aug. 18, 2016

(30) Foreign Application Priority Data

Feb. 16, 2015 (JP) .................. 2015-028053

(51) Int. Cl.
*H02H 3/00* (2006.01)
*H02P 29/024* (2016.01)
(Continued)

(52) U.S. Cl.
CPC .......... *H02P 29/024* (2013.01); *G01R 31/041* (2013.01); *H02P 29/0241* (2016.02);
(Continued)

(58) Field of Classification Search
CPC ........ H02P 8/36; H02P 29/60; H02G 2200/20
(Continued)

(56) References Cited

U.S. PATENT DOCUMENTS 8,436,568 B2 * 5/2013 Mukai .................... B62D 5/04  
                                                  180/443  
8,514,537 B2 * 8/2013 Higuchi ............... H02M 3/156  
                                                  361/103  
(Continued)

FOREIGN PATENT DOCUMENTS

JP         720190 A     1/1995  
JP         916233 A     1/1997  
(Continued)

OTHER PUBLICATIONS

English Abstract and Machine Translation for Japanese Publication No. 09-016233 A, published Jan. 17, 1997, 65 pgs.

(Continued)

*Primary Examiner* — Bickey Dhakal  
(74) *Attorney, Agent, or Firm* — Fredrikson & Byron, P.A.

(57) ABSTRACT

A motor control apparatus according to one aspect of the present invention is configured to be connected to a motor by a wiring line, and includes: a motor driving unit for driving a motor; a current command unit for commanding supply of current to the motor driving unit; and, a miswiring detecting unit for detecting miswiring of lines connected to motors by acquiring via wiring lines a signal indicating the motor temperature detected by a motor temperature detector provided for the motor, wherein the miswiring detecting unit detects presence or absence of miswiring of the wiring lines, based on the change of the motor temperature when the current command unit commands supply of reactive current to the motor driving unit.

6 Claims, 10 Drawing Sheets

(51) Int. Cl.
  *H02P 29/60* (2016.01)
  *G01R 31/04* (2006.01)
  *H02P 5/74* (2006.01)
  *G01R 31/34* (2006.01)

(52) U.S. Cl.
  CPC ............ *H02P 29/60* (2016.02); *G01R 31/343* (2013.01); *G05B 2219/42301* (2013.01); *H02P 5/74* (2013.01)

(58) Field of Classification Search
  USPC .......................................................... 361/46
  See application file for complete search history.

(56) References Cited

U.S. PATENT DOCUMENTS

| | | | | |
|---|---|---|---|---|
| 2001/0038661 | A1* | 11/2001 | Mori | G01K 7/00 374/45 |
| 2007/0253132 | A1* | 11/2007 | Nakamura | H02H 6/005 361/103 |
| 2013/0250463 | A1* | 9/2013 | Ueta | H02H 7/18 361/87 |
| 2015/0116883 | A1* | 4/2015 | Kimoto | B60R 16/02 361/103 |

FOREIGN PATENT DOCUMENTS

| | | |
|---|---|---|
| JP | 200032616 A | 1/2000 |
| JP | 2004103031 A | 4/2004 |
| JP | 2004180441 A | 6/2004 |
| JP | 201393957 A | 5/2013 |
| WO | WO 2013115112 A1 * | 8/2013 ............. B60R 16/02 |

OTHER PUBLICATIONS

English Abstract and Machine Translation for Japanese Publication No. 07-020190 A, published Jan. 24, 1995, 8 pgs.
English Abstract and Machine Translation for Japanese Publication No. 2004-103031 A, published Apr. 2, 2004, 70 pgs.
English Abstract and Machine Translation for Japanese Publication No. 2013-093957 A, published May 16, 2013, 15 pgs.
English Abstract and Machine Translation for Japanese Publication No. 2004-180441 A, published Jun. 24, 2004, 13 pgs.
English Abstract and Machine Translation for Japanese Publication No. 2000-032616 A, published Jan. 28, 2000, 15 pgs.

* cited by examiner

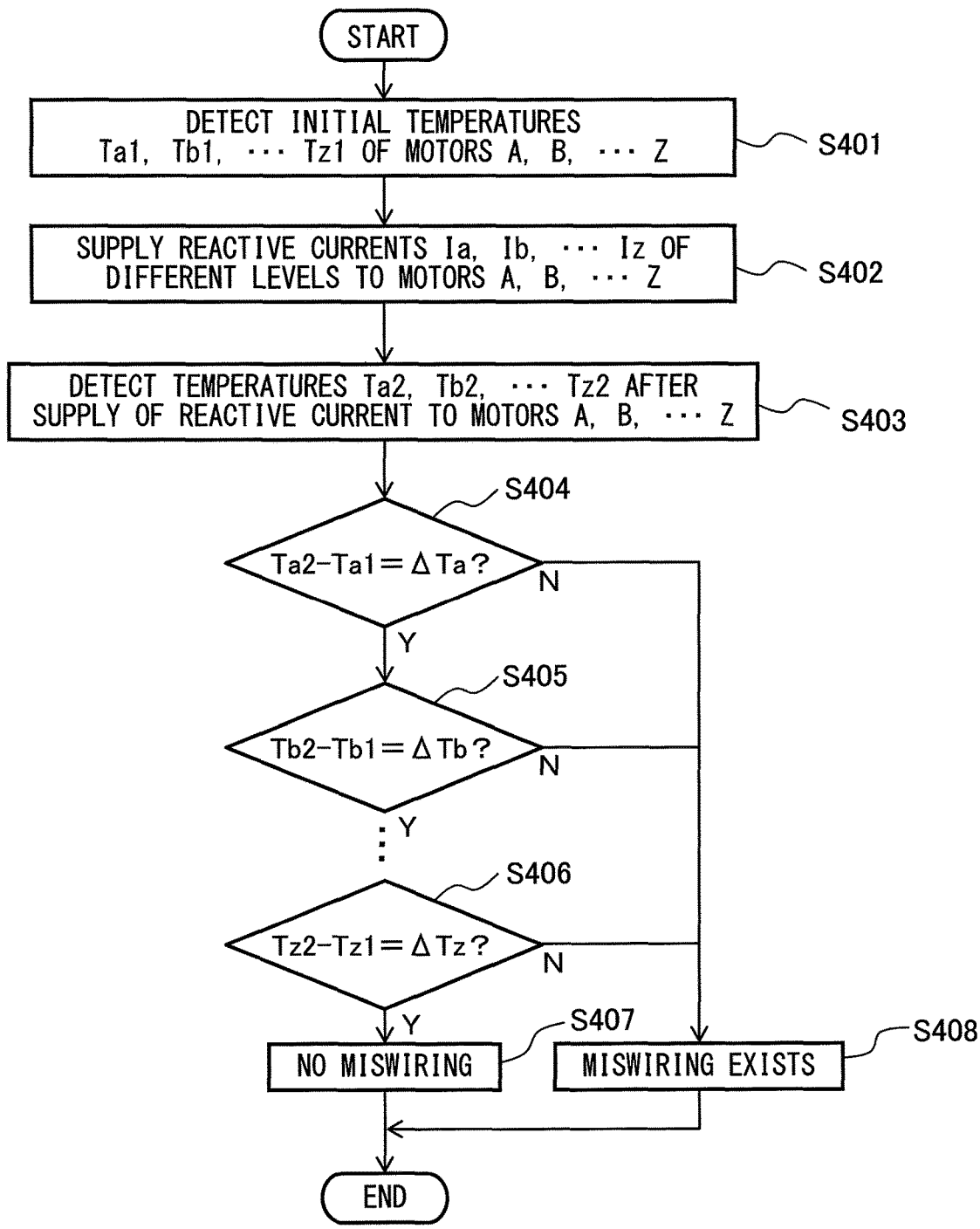

MOTOR CONTROL APPARATUS HAVING A FUNCTION OF DETECTING MISWIRING

BACKGROUND OF THE INVENTION

1. Field of the Invention

The present invention relates to a motor control apparatus, in particular to a motor control apparatus having a function of detecting miswiring of motor signal lines.

2. Description of the Related Art

In order to drive a motor, power lines to the motor and signal lines to detectors need to be connected to a motor control apparatus. Since connection of these power lines and signal lines is manually performed, miswiring could happen frequently.

As examples of miswiring of power lines, wrong phase procedures, open phases, short-circuits and the like are listed. As a means for mechanically determining whether or not power lines are miswired, there have been known methods such as a method of detecting excess or deficiency of electric current under application of voltage (e.g., Japanese Unexamined Patent Publication (Kokai) No. H09-16233) and a method of performing a comparison between the current value and motor torque (e.g., Japanese Unexamined Patent Publication (Kokai) No. H07-20190).

As an example of miswiring of signal lines, there is a case where, when there exist multiple pairs of a detector and a motor control apparatus, the motor control apparatuses are connected to wrong detectors, by mistakenly selecting wrong combinations. As a means for mechanically determining whether or not the signal lines are miswired, there have been known methods such as a method in which the detector type designated by a parameter and the actually connected detector are compared so as to detect whether or not the designated detector is correctly connected (e.g., Japanese Unexamined Patent Publication (Kokai) No. 2004-103031, which will be referred to hereinbelow as "Patent Document 3").

Other than the above detecting methods, methods of determining whether or not the power lines and signal lines are connected correctly by actually driving the motor have been generally used.

Use of the prior art makes it possible to detect miswiring of power lines even for motors having multiple windings. However, for detection of miswiring of signal lines, when the detection method of Patent Document 3 is used, detection of miswiring is difficult when the same type of detector is used in multiple motors.

Further, in a mechanical configuration in which a single axis is driven by multiple motors, if the phases of the individual motors coincide with one another, no faults are detected from the detectors so that the axis can be driven despite miswired conditions, though the motors may be lowered in power factor and become unstable from a control viewpoint.

Next, miswiring in conventional motor control apparatuses will be described. FIG. 1 is a block diagram showing a miswired condition of signal lines with multiple motors and motor control apparatuses in the prior art. One motor is driven by one corresponding motor control apparatus. In a machine in which multiple axes are operated, there are multiple pairs each composed of a motor and a corresponding motor control apparatus. FIG. 1 shows an example where two pairs of a motor and a motor control apparatus are provided. A motor control apparatus A (1001A) controls a motor A (10A) via a power line (not shown) while a motor control apparatus B (1001B) controls a motor B (10B) via a power line (not shown).

As to signal lines from detectors, the motor B (10B) is connected with the motor control apparatus A (1001A) via a wiring line 30A while the motor A (10A) is connected with motor control apparatus B (100B) via a wiring line 30B. In this way, when multiple pairs of a motor and a motor control apparatus are provided, it often happens that signal lines from detectors are miswired with wrong motor control apparatuses despite that the power lines are connected correctly. If the motors are driven in the miswired condition as above, the phases of the rotors cannot be fed back correctly, so that there is a risk that the motors are controlled and driven with excessive currents.

In the method shown in Patent Document 3, the model of the detector to be used for the motor control apparatus is entered as a parameter, and when the connected detector does not correspond to the entered model, miswiring is detected.

However, this method has the problem that miswiring cannot be detected when multiple motors use the same type of detectors because it is impossible to distinguish one detector from another.

Further, miswiring may occur when one single axis is driven by multiple motors (tandem drive). FIG. 2 is a block diagram showing miswiring of signal lines in tandem driving mode in the prior art. FIG. 2 shows an example where two pairs of a motor and a motor control apparatus are provided to drive a single axis 100. Connections of power lines of motor control apparatuses A (1002A) and B (1002B) with respective motors A (10A) and B (10B) by power lines (not shown) and connections of signal lines from the detectors are the same as those in the example shown in FIG. 1.

In the tandem drive, since the rotor phases of the multiple motors rotate simultaneously, the motors apparently seem to drive normally if the rotor phases of the multiple motors coincide with each other by chance. However, once the rotator phases become different from each other for some unspecified reason, the motors rotate in full torque, conceivably having serious influence such as causing damage to the machine itself or the work.

SUMMARY OF THE INVENTION

As above, it is therefore an object of the present invention to provide a motor control apparatus that can detect miswiring without driving the motors when multiple motors use the same type of detectors and when the rotor phases coincide with each other.

A motor control apparatus according to one aspect of the present invention is configured to be connected to a motor by a wiring line, and includes: a motor driving unit for driving a motor; a current command unit for commanding supply of current to the motor driving unit; and, a miswriting detecting unit for detecting miswiring of lines connected to motors by acquiring via a line a signal indicating the motor temperature detected by a motor temperature detector provided for the motor, and the miswiring detecting unit detects presence or absence of miswiring of wiring lines, based on the change of the motor temperature when the current command unit commands supply of reactive current to the motor driving unit.

BRIEF DESCRIPTION OF THE DRAWINGS

The object, features and advantages of the present invention will be better understood by reading the following description of the embodiments, taken together with the drawings wherein.

DESCRIPTION OF THE INVENTION

Figure 1:
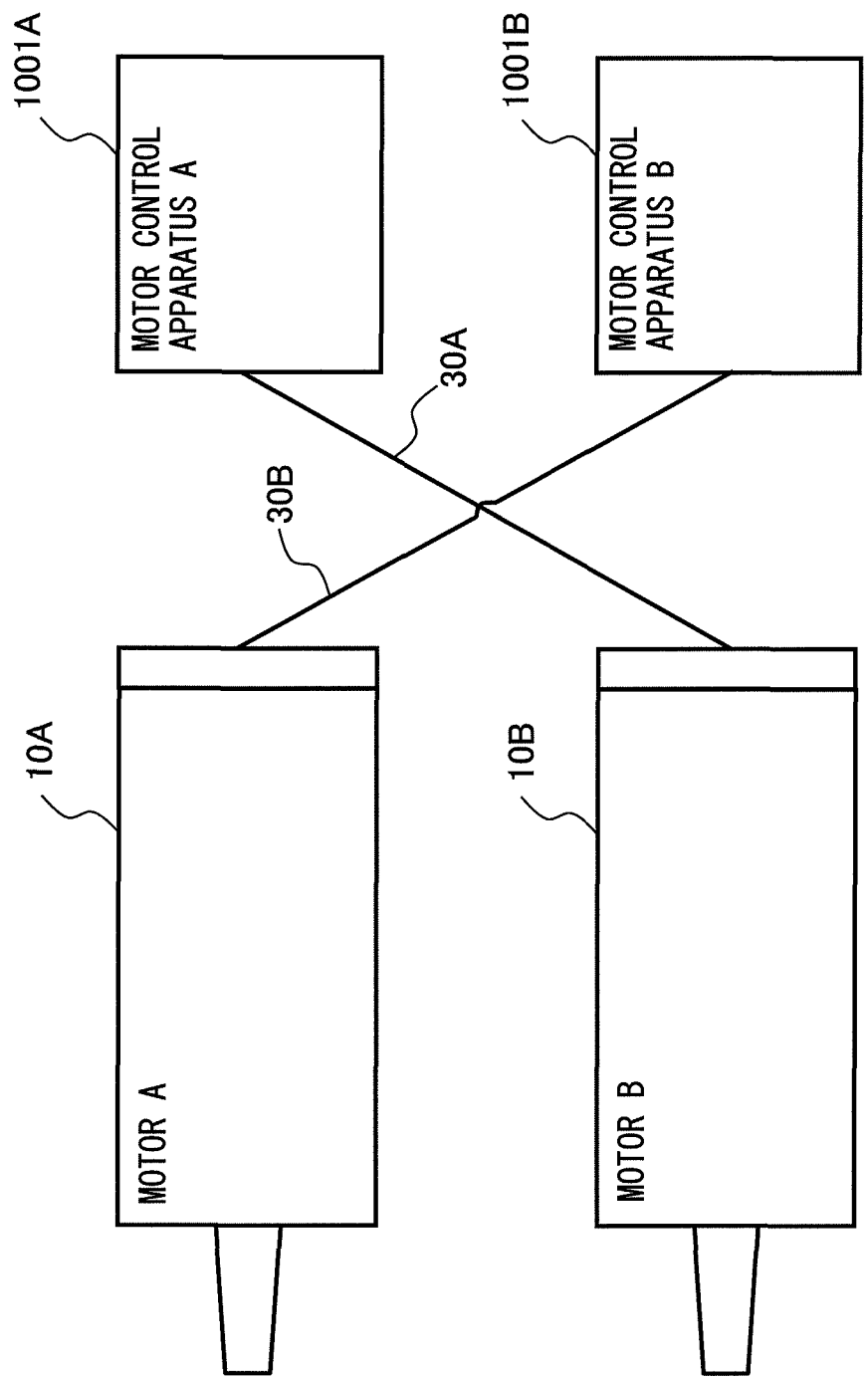
FIG. 1 is a block diagram showing a miswired condition of signal lines in a configuration including multiple motors and motor control apparatuses in the prior art.
Figure 2:
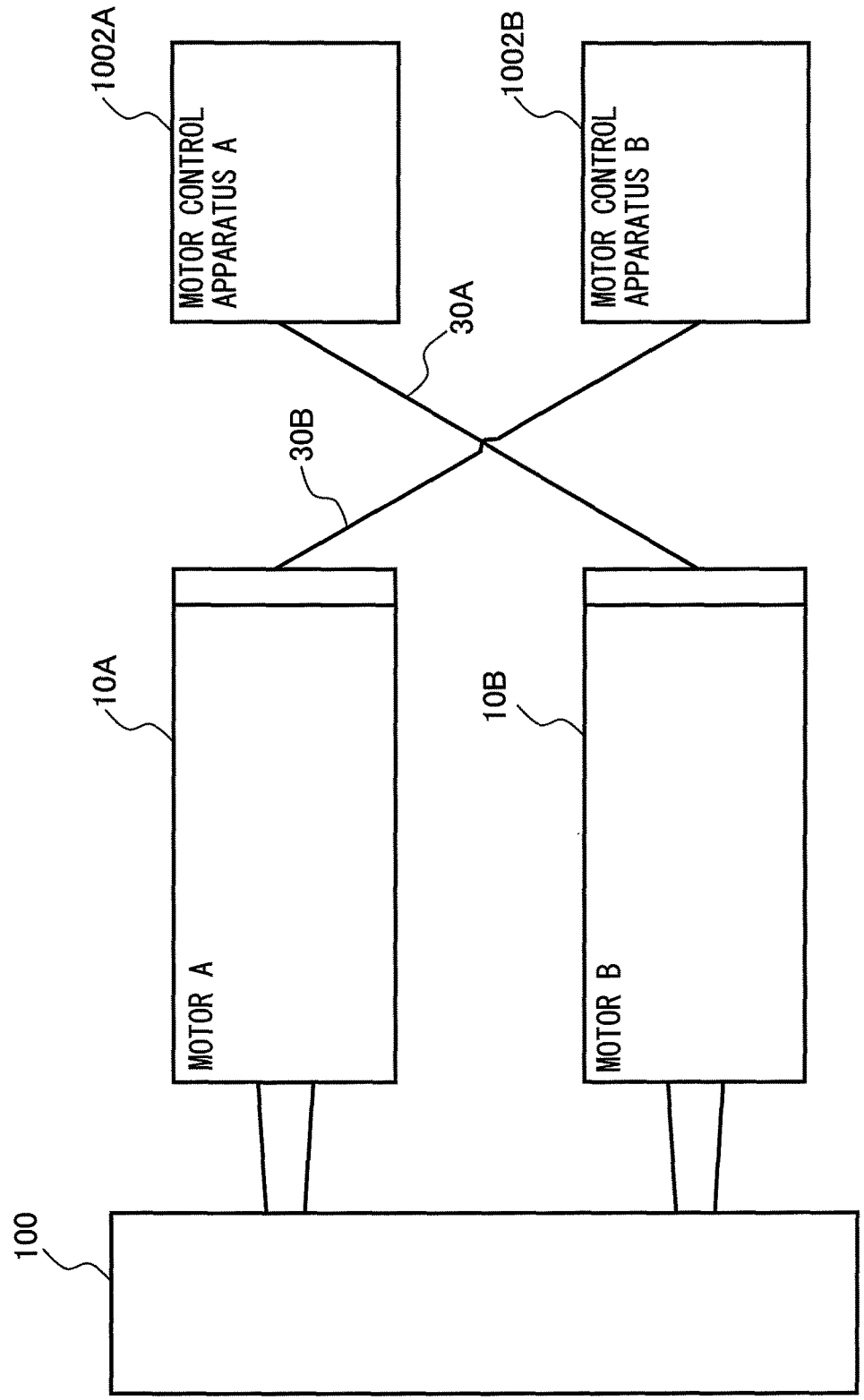
FIG. 2 is a block diagram showing a miswired condition of signal lines at the time of tandem drive in the prior art.

Referring now to the drawings, motor control apparatuses according to the present invention will be described.

First Embodiment

Figure 3:
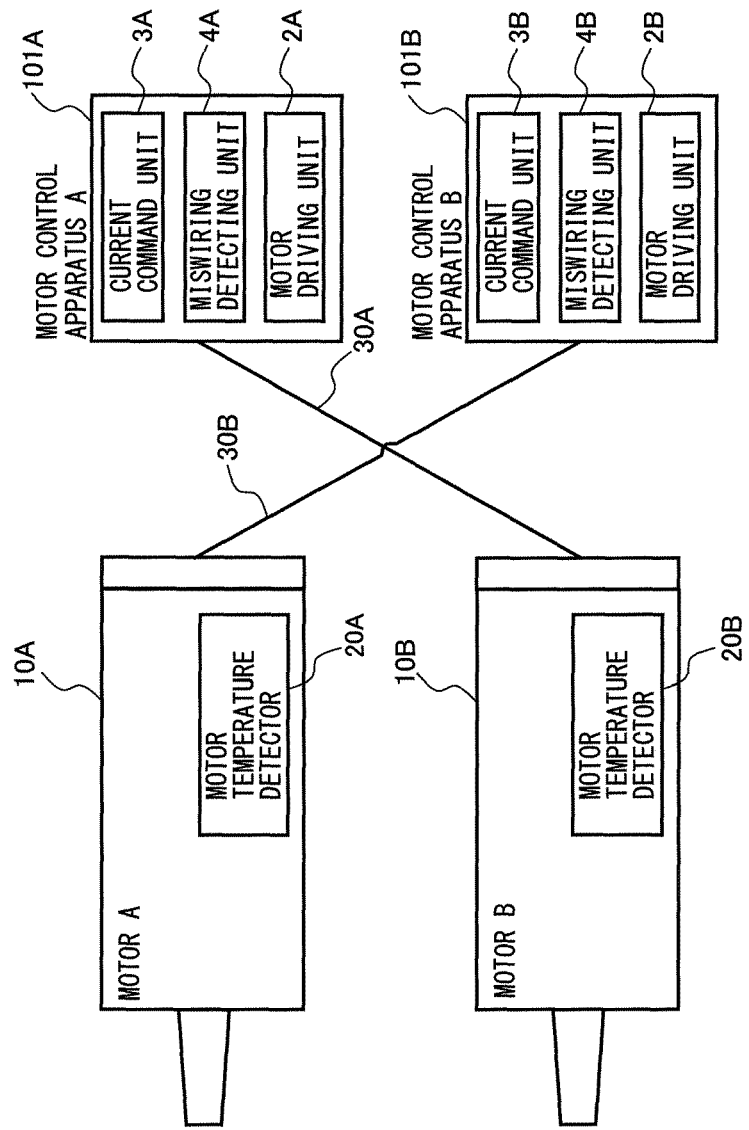
FIG. 3 is a block diagram showing a motor control apparatus according to a first embodiment of the present invention.

To begin with, a motor control apparatus according to the first embodiment of the present invention will be described with reference to the drawings. FIG. 3 is a block diagram showing a motor control apparatus according to the first embodiment of the present invention. A motor control apparatus 101A according to the first embodiment of the present invention is a motor control apparatus configured to be connected to a motor 10A by a wiring line 30A, and includes a motor driving unit 2A for driving a motor, a current command unit 3A for commanding supply of current to the motor driving unit, and a miswriting detecting unit 4A for detecting miswiring of lines connected to motors by acquiring a signal indicating the motor temperature detected by a motor temperature detector 20A provided for the motor. The motor control apparatus 101A is constructed such that the miswiring detecting unit 4A detects whether or not the wiring line 30A is miswired, based on the change of the motor temperature when the current command unit 3A commands supply of reactive current to the motor driving unit 2A.

Next description will be made on a method of detecting miswiring in the motor control apparatus according to the first embodiment of the present invention. First, as shown in FIG. 3, the current command unit 3A commands supply of reactive current to the motor driving unit 2A in the motor control apparatus A (101A). Herein, the reactive current refers to phase current that will not contribute to rotation of the motor. When reactive current flows through the motor A (10A), the motor A (10A) will not rotate. However, the current is consumed by the coil resistance in the motor A (10A) to generate heat, so that the motor A (10A) rises in temperature. As the temperature of the motor A (10A) rises, the temperature detected by motor temperature detector 20A inside the motor A (10A) changes. This change in temperature is made use of by the miswiring detecting unit 4A to detect miswiring.

In the example of FIG. 3, a command of supplying reactive current is given by the motor control apparatus A (101A) and the temperature of the motor A rises. Under normal conditions, the wiring line 30A should be connected between the motor A (10A) and the motor control apparatus A (101A), however, as the motor control apparatus A (101A) is miswired to a motor B (10B), the temperature change detected by the motor temperature detector 20B in the motor B (10B) is fed back to the miswiring detecting unit 4A of the motor control apparatus A (101A). Since no current is applied to the motor B (10B), no temperature change takes place. Accordingly, this configuration makes it possible for the miswiring detecting unit 4A that judges the presence or absence of a temperature change in the motor control apparatus A (101A) to determine the relationship between the reactive current command and the temperature change and thereby detect if miswiring has occurred.

Use of the above method enables detection of miswiring even if the rotors of the motor A (10A) and motor B (10B) are in the same phase. The motor temperature detector 20A detects the temperature of, for example, windings of the motor.

As the miswiring determining method performed at the miswiring detecting unit 4A, the following two methods can be considered.

[1] The First Determining Method

The initial temperature Ta1 before supply of reactive current and the temperature Ta2 after supply of reactive current are compared based on a first reference value X as a fixed threshold value. More specifically, the miswiring detecting unit 4A determines the occurrence of miswiring when the difference between the motor temperature Ta1 detected before the current command unit 3A commands supply of reactive current, and the motor temperature Ta2 detected after the current command unit 3A commands supply of reactive current is smaller than the first reference value X.

For example, it is determined that no miswiring exists if $(Ta2-Ta1) \geq X$ and miswiring exists if $(Ta2-Ta1) < X$.

[2] The Second Determining Method

The temperature Ta of a motor to be examined and the temperature Tb of another motor to which no reactive current is applied are compared based on a fixed threshold value X.

For example, it is determined that no miswiring exists if $(Ta-Tb) \geq X$ and miswiring exists if $(Ta-Tb) < X$.

Figure 4:
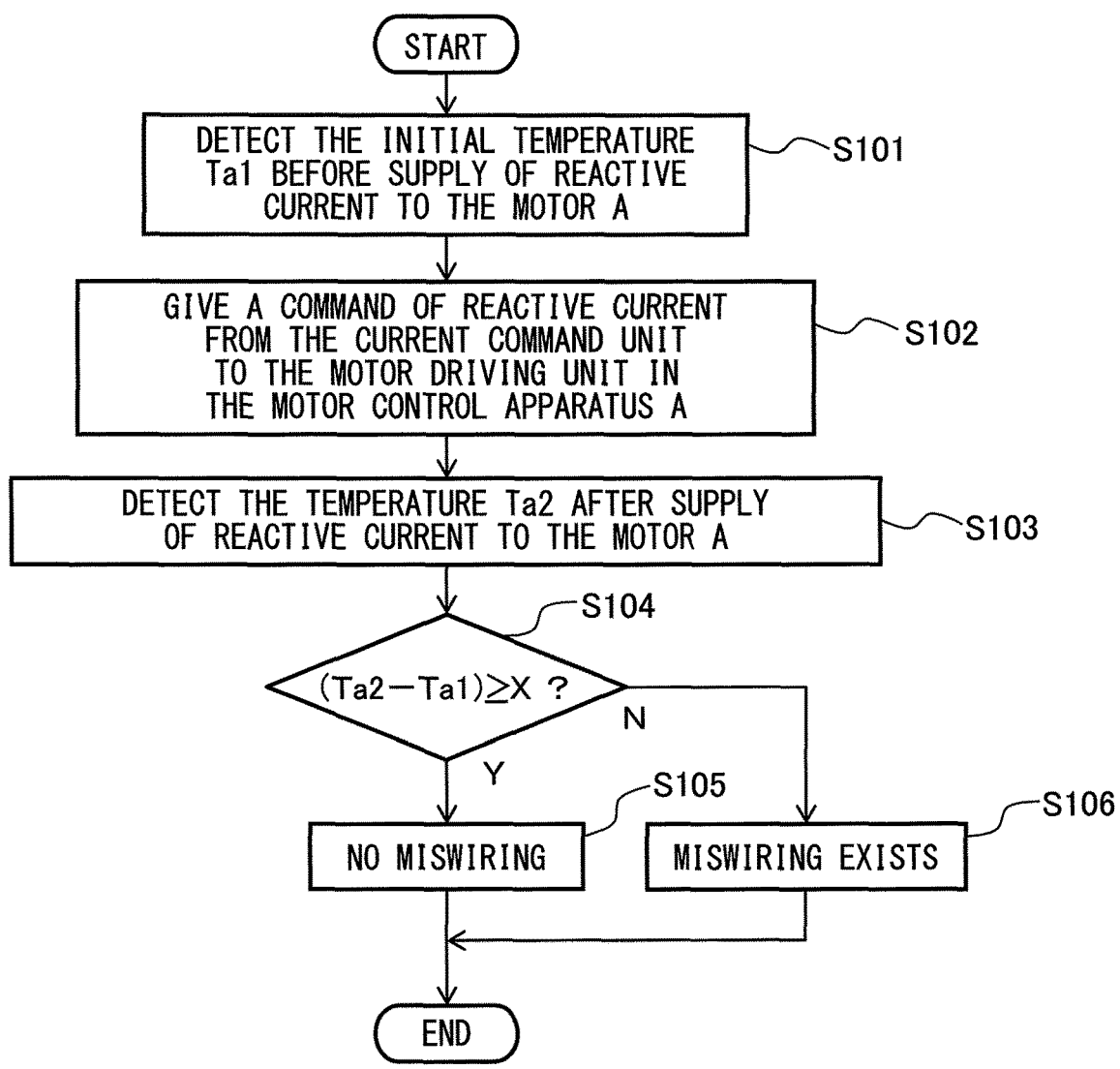
FIG. 4 is a flow chart for illustrating a procedure of detecting miswiring in a motor control apparatus according to the first embodiment of the present invention.

The above two determining methods will be explained in detail. First, the above first determining method [1] will be described. FIG. 4 is a flow chart for illustrating a miswiring detecting procedure of the motor control apparatus according to the first embodiment of the present invention.

First, at Step S101 the initial temperature Ta1 before supply of reactive current to the motor A is detected. Specifically, the miswiring detecting unit 4A of the motor control apparatus A (101A) receives a signal indicating the motor temperature detected by the motor temperature detector provided at the motor, via a wiring line. At this stage, when wiring has been correctly connected, the motor temperature of the motor A (10A) detected by the motor temperature detector 20A is sent to the miswiring detecting unit 4A. On the other hand, when there is miswiring such that the motor control apparatus A (101A) and the motor B (10B) are connected by the wiring line 30A as shown in FIG. 3, the motor temperature of the motor B (10B) detected by the motor temperature detector 20B is sent to the miswiring detecting unit 4A.

Next, at Step S102 the current command unit 3A gives a command of supplying reactive current to the motor driving unit 2A inside the motor control apparatus A (101A). The commanded reactive current is supplied from the motor control apparatus A (101A) to the motor A (10A) via a power line (not shown). Since the reactive current is a phase current that will not contribute to rotation of the motor, the rotor of the motor A (10A) will not be rotated by the supplied reactive current. However, since the reactive current is consumed as heat through the coil resistance in the motor A, the temperature of the motor A (10A) rises.

Then, at Step S103, the temperature Ta2 after reactive current has flowed through the motor A (10A) is detected. In the example shown in FIG. 3, the wires are misconnected such that the signal line of the motor A (10A) for transmitting the motor temperature detected by the motor temperature detector 20A is connected to the motor control apparatus B (101B) while the signal line of the motor B (10B) for transmitting the motor temperature detected by the motor temperature detector 20B is connected to the motor control apparatus A (101A). Accordingly, in the example shown in FIG. 3, the motor temperature Ta2 acquired by the miswiring detecting unit 4A in the motor control apparatus A (101A) is the motor temperature of the motor B.

Next, at Step S104 it is determined whether or not the following expression (1) holds: —

$$(Ta2-Ta1)>X \tag{1}$$

The first reference value X is a predetermined threshold value and preferably set at such a value as to be greater than the variation of temperature resulting from environmental change and smaller than the temperature rise resulting from supply of reactive current.

In the example shown in FIG. 3, the temperature Ta2 after the supply of reactive current to the motor A is considered to be practically unchanged from the initial temperature Ta1 before the supply of reactive current to the motor A, so that the Ex. (1) will not hold, it is hence possible to detect occurrence of miswiring at Step S106.

On the other hand, differing from FIG. 3, when wires are connected correctly so that the signal line from the motor A (10A) is connected to the motor control apparatus A (101A) while the signal line from the motor B (10B) is connected to the motor control apparatus B (101B), the miswiring detecting unit 4A of the motor control apparatus A (101A) can acquire the motor temperature of the motor A detected by the motor temperature detector 20A of the motor A (10A), hence detect the temperature rise of the motor A (10A). As a result, Ex. (1) holds, it is hence possible to determine that no miswiring has occurred, at Step S105.

As described above, according to the first determining method, it is possible to detect presence or absence of miswiring by the miswiring detecting unit 4A of the motor control apparatus A (101A) alone.

Figure 5:
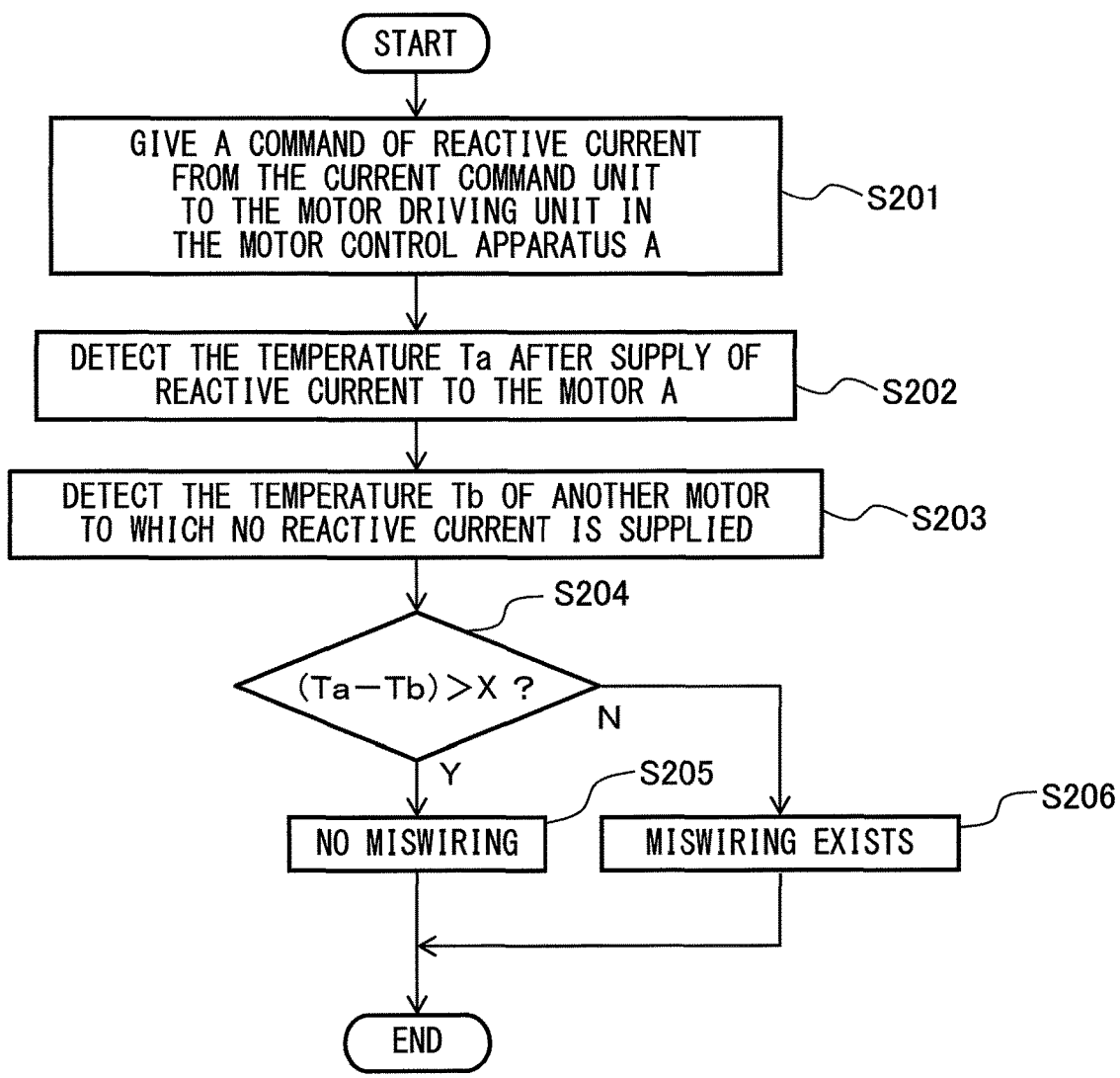
FIG. 5 is a flow chart for illustrating another procedure of detecting miswiring in a motor control apparatus according to the first embodiment of the present invention.

Next, the second determining method [2] will be described with reference to FIG. 5, i.e., a flow chart for illustrating another example of a miswiring detecting procedure of the motor control apparatus according to the first embodiment of the present invention.

First, at Step S201 the current command unit 3A gives a command of supplying reactive current to the motor driving unit 2A inside the motor control apparatus A (101A). The commanded reactive current is supplied from the motor control apparatus A (101A) to the motor A (10A) via a power line (not shown). The reactive current is a phase current that will not contribute to rotation of the motor, so that the rotor of the motor A (10A) will not be rotated by the supplied reactive current. However, since the reactive current is consumed as heat through the coil resistance of the motor A, the temperature of the motor A (10A) rises.

Then, at Step S202, the temperature Ta after the supply of reactive current to the motor A is detected. Specifically, as shown in FIG. 3, the miswiring detecting unit 4A of the motor control apparatus A (101A) receives the signal indicating the motor temperature detected by the motor temperature detector provided at the motor by way of wiring. Herein, when wires are connected correctly, the temperature of the motor A (10A) detected by the motor temperature detector 20A is sent to the miswiring detecting unit 4A. On the other hand, when the wiring line 30A is miswired from the motor control apparatus A (101A) to the motor B (10B) as shown in FIG. 3, the temperature of the motor B (10B) detected by the motor temperature detector 20B is sent to the miswiring detecting unit 4A. Because no reactive current is supplied to the motor B, the detected temperature Ta is considered to be practically unchanged from before the supply of reactive current.

Next, at Step S203 the temperature Tb of the motor B (10B) as another motor with no reactive current supplied is detected. In the example shown in FIG. 3, the wires are miswired such that the signal line of the motor A (10A) for transmitting the motor temperature detected by the motor temperature detector 20A is connected to the motor control apparatus B (101B) while the signal line of the motor B (10B) for transmitting the motor temperature detected by the motor temperature detector 20B is connected to the motor control apparatus A (101A). Accordingly, in the example shown in FIG. 3, the motor temperature Tb acquired by the miswiring detecting unit 4B in the motor control apparatus B (101B) is the motor temperature of the motor A. Since reactive current is supplied to the motor A, the detected temperature Tb is considered to be higher than Ta.

Next, at Step S204 it is determined whether or not the following expression (2) holds: —

$$(Ta-Tb)>X \tag{2}$$

X is a predetermined threshold value and preferably set at such a value as to be greater than the variation of temperature resulting from environmental change and smaller than the temperature rise resulting from the supply of reactive current.

In the example shown in FIG. 3, the motor temperature Ta acquired by the miswiring detecting unit 4A of the motor control apparatus A (101A) is the temperature of the motor B to which no reactive current is supplied whereas the motor temperature Tb acquired by the miswiring detecting unit 4B of the motor control apparatus B (101B) is the temperature of the motor A to which reactive current is supplied, so that it is considered that Tb>Ta holds. Accordingly, in this case, Ex. (2) does not hold, so that it is possible to detect occurrence of miswiring at Step S206.

On the other hand, differing from FIG. 3, when wires are connected correctly so that the signal line from the motor A (10A) is connected to the motor control apparatus A (101A)

while the signal line from the motor B (10B) is connected to the motor control apparatus B (101B), the miswiring detecting unit 4A of the motor control apparatus A (101A) can acquire the motor temperature of the motor A detected by the motor temperature detector 20A of the motor A (10A) and the miswiring detecting unit 4B of the motor control apparatus B (101B) can acquire the motor temperature of the motor B detected by the motor temperature detector 20B of the motor B (10B). Accordingly, the miswiring detecting unit 4A can detect the temperature rise of the motor A (10A). As a result, Ex. (2) holds, it is hence possible to determine that no miswiring has occurred, at Step S205.

As above, according to the second determining method, it is possible to detect presence or absence of miswiring instantly based on the motor temperatures detected by multiple miswiring detecting units.

As described above, according to the motor control apparatus according to the first embodiment of the present invention, since supply of reactive current to the motor will not turn the motor, it is possible to detect the presence or absence of miswiring in a safe manner.

Second Embodiment

Figure 6:
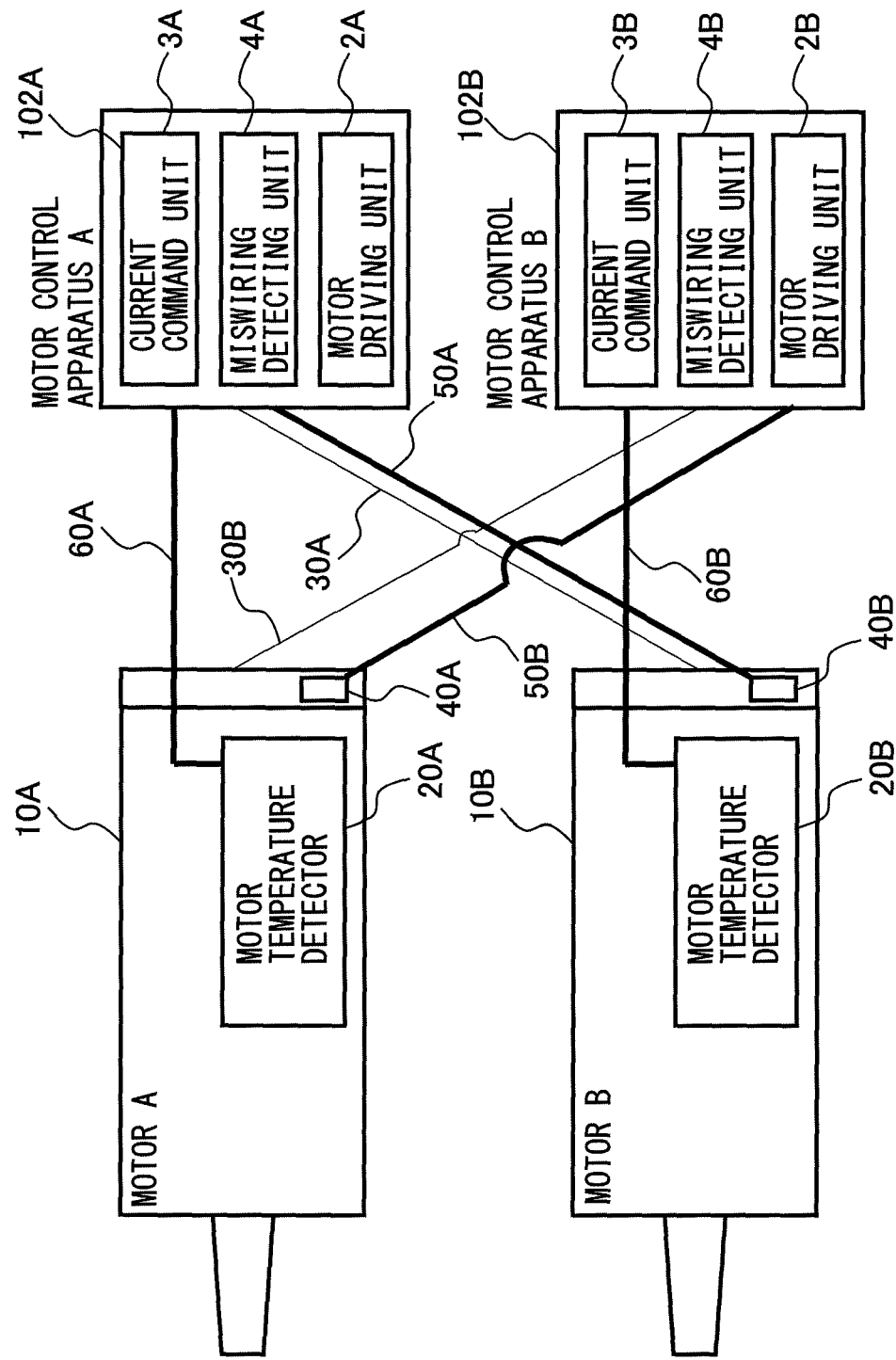
FIG. 6 is a block diagram showing a motor control apparatus according to a second embodiment of the present invention.

Next, a motor control apparatus according to the second embodiment of the present invention will be described with reference to the drawings. FIG. 6 is a block diagram showing a motor control apparatus according to the second embodiment of the present invention. A motor control apparatus 102A according to the second embodiment of the present invention is different from the motor control apparatus 101A according to the first embodiment, in that the miswiring detecting unit 4A acquires information on the position detector temperature from a detector temperature-detecting unit 40A that detects the temperature of a position detector of the motor, via a second wiring line 50A, and detects the presence or absence of miswiring based on the compared result between the detected motor temperature and the detected position detector temperature. The other configurations of the motor control apparatus 102A according to the second embodiment of the present invention are the same as those in the motor control apparatus 101A of the first embodiment of the present invention, so a detailed description is omitted.

As shown in FIG. 6, the motor control apparatus according to the second embodiment of the invention is characterized in that the presence or absence of miswiring is determined by using the detector temperature-detecting unit 40A provided for a position detector (not shown) of the motor A (10A). Since the position detector is coupled and fixed to the motor A (10A), the temperature of the position detector rises due to heat transfer when the motor A (10A) generates heat. By use of this feature, the temperature Tma detected by the motor temperature detector 20A of the motor A (10A) and the temperature Tda detected by the detector temperature-detecting unit 40A are compared based on a fixed threshold value to determine whether or not miswiring has occurred. That is, the miswiring detecting unit 4A determines occurrence of miswiring when the difference between the detected motor temperature Tma and the detected position detector temperature Tda is greater than a second reference value.

Since Tma and Tda are considered to be practically equal to each other if wiring is correctly connected, it is possible to determine that there is no miswiring if the absolute value of the difference between the two is small. On the other hand, if miswiring is taking place, the difference between Tma and Tda becomes conspicuous, so that it is possible to determine that there is miswiring when the difference between the two becomes large and greater than the predetermined threshold value.

In the example shown in FIG. 6, the motor temperature detector 20A of the motor A (10A) is connected to the motor control apparatus A (102A) via a third wiring line 60A while the motor temperature detector 20B of the motor B (10B) is connected to the motor control apparatus B (102B) via a third wiring line 60B, so that there is no miswiring.

On the other hand, the detector temperature-detecting unit 40A provided for the motor A (10A) is connected to the motor control apparatus B (102B) via a second wiring line 50B while the detector temperature-detecting unit 40B provided for the motor B (10B) is connected to the motor control apparatus A (102A) via a second wiring line 50A so that miswiring has occurred. Though, in FIG. 6, wiring lines 30A and 30B are shown, in this embodiment the motor temperatures detected by motor temperature detectors 20A and 20B are transmitted to the motor control apparatus A (102A) and the motor control apparatus B (102B) via the third wiring lines 60A and 60B as described above.

Figure 7:
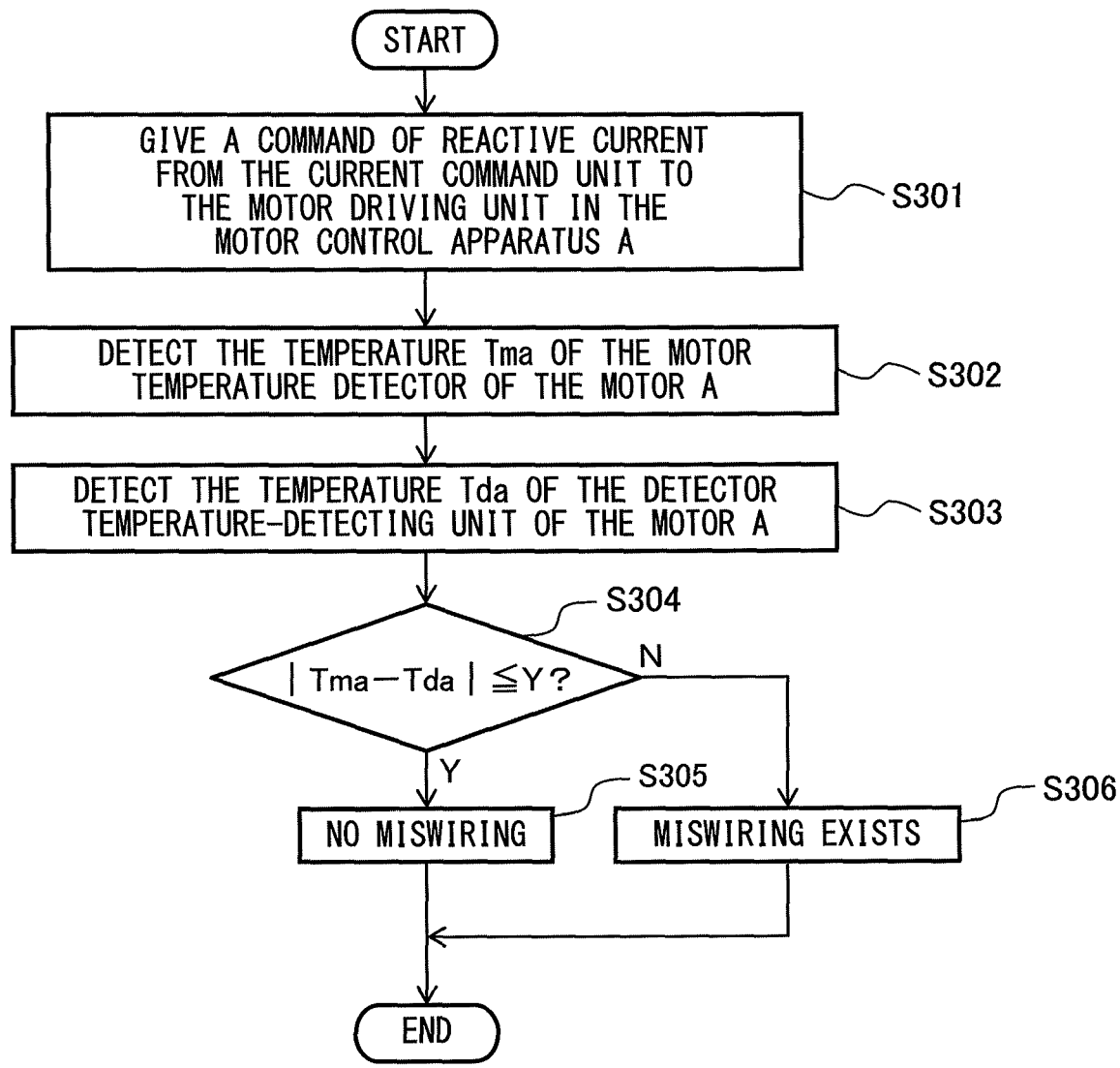
FIG. 7 is a flow chart for illustrating a procedure of detecting miswiring in a motor control apparatus according to the second embodiment of the present invention.

The miswiring detecting procedure of the motor control apparatus according to the second embodiment of the present invention when the above miswiring has occurred will be described with reference to the flow chart shown in FIG. 7.

First, at Step S301 the current command unit 3A gives a command of supplying reactive current to the motor driving unit 2A inside the motor control apparatus A (102A). The commanded reactive current is supplied from the motor control apparatus A (102A) to the motor A (10A) via a power line (not shown). The reactive current is a phase current that will not contribute to rotation of the motor, so that the rotor of the motor A (10A) will not be rotated by the supplied reactive current. However, since the reactive current is consumed as heat through the coil resistance of the motor A, the temperature of the motor A (10A) rises.

Then, at Step S302, the temperature Tma of the motor temperature-detector 20A of the motor A (10A) is detected. The detected motor temperature Tma of the motor A is transmitted from motor temperature detector 20A to the miswiring detecting unit 4A of the motor control apparatus A (102A) via the third wiring line 60A. Since the third wiring line 60A is correctly connected, it is expected that the motor temperature Tma is higher than normal state.

Next, at Step S303 the temperature Tda of the detector temperature-detecting unit 40A of the motor A (10A) is detected. In this case, as shown in FIG. 6 the second wiring lines 50A and 50B that connect detector temperature-detecting units 40A and 40B with the miswiring detecting units 4A and 4B are miswired. Accordingly, the position detector temperature of the motor A detected by the detector temperature detecting unit 40A is transmitted to the miswiring detecting unit 4B of the motor control apparatus B (102B) via the second wiring line 50B from the detector temperature-detecting unit 40A. On the other hand, the position detector temperature of the motor B detected by the detector temperature detecting unit 40B is transmitted from the detector temperature-detecting unit 40B to the miswiring detecting unit 4A of the motor control apparatus A (102A) via the second wiring line 50A. Accordingly, the position detector temperature Tda acquired by the miswiring detecting unit 4A is the temperature of the motor B, hence is approximately equal to the temperature before the supply of reactive current.

Next, at Step S304 it is determined whether or not the following expression (3) holds.

$$|Tma - Tda| \leq Y \qquad (3)$$

Here, Y is a predetermined threshold value or the second reference value. It is determined that no miswiring exists when Ex. (3) holds and miswiring has occurred otherwise.

In the example shown in FIG. 6, Tma is the temperature of the motor A after supply of reactive current, hence shows a high value. On the other hand, Tda is the temperature of the motor B to which no reactive current is supplied, hence shows a low value. As a result, it is considered that the absolute value of the difference between Tma and Tda takes a large value, hence Ex. (3) will not hold. Thus, it is possible to determine that miswiring has occurred.

Differing from FIG. 6, when no miswiring has occurred, Tma and Tda acquired by the miswiring detecting unit 4A are the temperatures of the motor A detected by motor temperature detector 20A and the detector temperature-detecting unit 40A, respectively, both of them show high values, hence it is considered that the absolute value of the difference between the two is small. As a result, Ex. (3) holds, and it is possible to determine that no miswiring has occurred, at Step S305. Ex. (3) also holds when the second wiring lines 50A, 50B and the third wiring lines 60A, 60B are both miswired. However, it seems to be unlikely that miswiring has occurred at two sites simultaneously.

As described above, the motor control apparatus of the second embodiment of the present invention, will not receive any influence of heat transfer from the open air and from the machine body, hence can determine whether or not miswiring has occurred, in a more precise manner than the control apparatus of the first embodiment.

Third Embodiment

Figure 8:
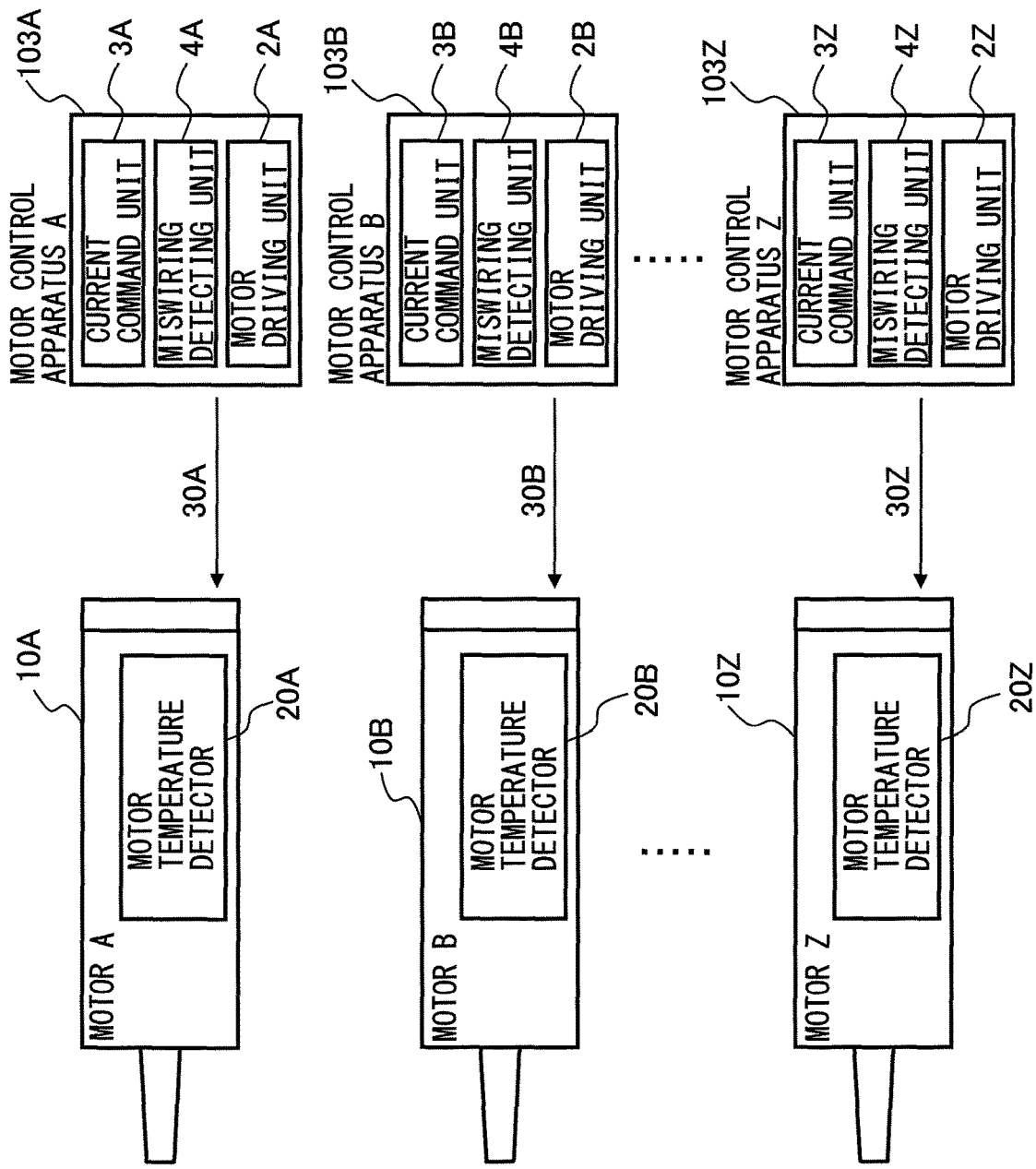
FIG. 8 is a block diagram showing a motor control apparatus according to a third embodiment of the present invention.

Next, a motor control apparatus according to the third embodiment of the present invention will be described with reference to the drawings. FIG. 8 is a block diagram of a motor control apparatus according to the third embodiment of the present invention. The motor control apparatus according to the third embodiment of the present invention includes identical motor control devices 103A that are configured to be connected to n (n≥2) motors and n wiring lines 30A to 30Z, and includes n motor driving units 2A to 2Z for driving respective n motors 10A to 10Z, n current command units 3A to 3Z for commanding supply of current to n motor driving units, miswiring detecting units 4A to 4Z that respectively acquire motor temperature-indicating signals detected by n motor temperature detectors 20A to 20Z provided for each motor through wiring lines 30A to 30Z to detect miswiring of the wiring lines connected to the n motors 10A to 10Z, and when the m-th (m≤n) current command unit gives a command of supplying reactive current to the m-th motor driving unit, the miswiring detecting units 4A to 4Z detect presence or absence of miswiring based on the change of the motor temperature of the m-th motor.

It is also preferable that the n current command units 3A to 3Z each give a command of supplying a different amount of reactive current from each other, to respective n motor driving units 2A to 2Z.

Referring now to FIG. 8, a case will be considered in that current command units 3A, 3B, 3Z supply a different amount of reactive current from each other to motor driving units 2A, 2B, . . . , 2Z. Since the amount of heat generation is proportional to the square of the current value, the temperature changes detected by respective motor temperature detectors 20A, 20B, . . . , 20Z are different from each other. Use of this feature makes it possible to detect miswiring of multiple motors at the same time.

Figure 9A:
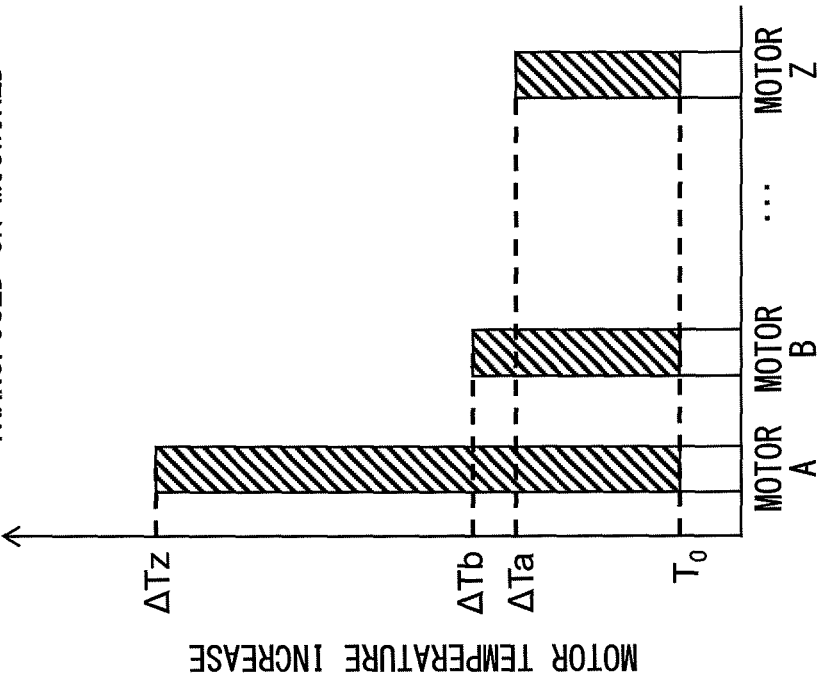
FIG. 9A is a graph comparatively showing the rise of motor temperature when wiring lines are miswired in a motor control apparatus according to the third embodiment of the present invention.
Figure 9B:
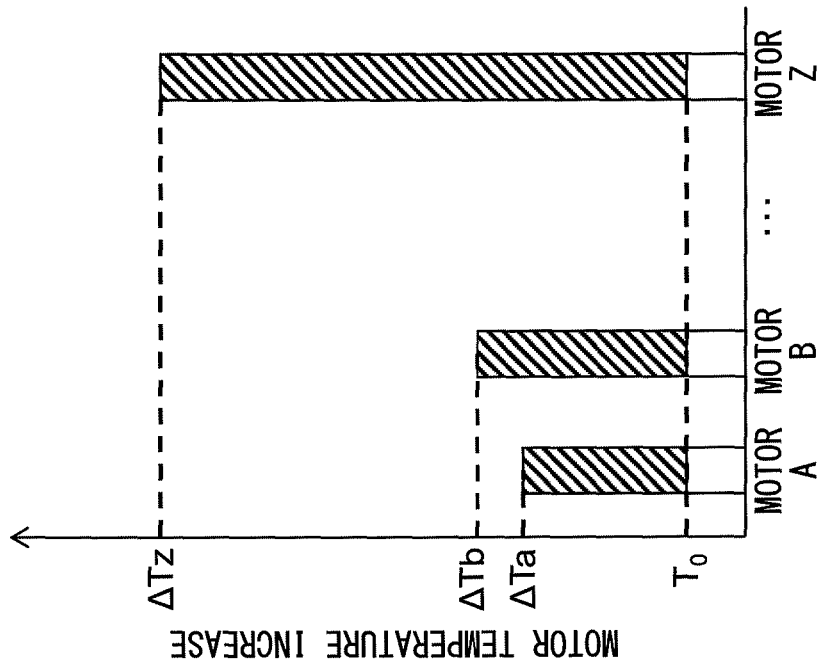
FIG. 9B is a graph comparatively showing the rise of motor temperature when wiring lines are miswired in a motor control apparatus according to the third embodiment of the present invention; and, FIG. 10 is a flow chart for illustrating a procedure of detecting miswiring in a motor control apparatus according to the third embodiment of the present invention.

For example, it is assumed that when reactive current Ia is supplied to the motor A, reactive current Ib is supplied to the motor B, . . . and reactive current Iz is supplied to the motor Z, the temperatures of the motors rise by $\Delta Ta$, $\Delta Tb$ . . . $\Delta Tz$, respectively when the reactive currents are supplied. In this case, if the correlation between the value of reactive current and the value of temperature rise is known, it is possible to identify the place where miswiring has occurred from the value of temperature rise. FIGS. 9A and 9B show examples of motor temperature rises when different levels of reactive current are supplied to motors A, B . . . Z in the case where the wiring lines are correctly connected and in a case where the wiring lines are miswired. In FIGS. 9A and 9B, the temperatures of the motors before supply of reactive current are represented by $T_0$ while the hatched areas show temperature rises (e.g., $\Delta Ta$).

As shown in FIG. 9A, if the temperature rise due to supply of reactive current Ia to the motor A is known to be $\Delta Ta$, it is possible to confirm that no miswiring has occurred because the temperature rise after supply of reactive current is $\Delta Ta$. Similarly, the same can be confirmed for the motors B to Z.

On the other hand, as shown in FIG. 9B, when the temperature rise of the motor A is $\Delta Tz$ and the temperature rise of the motor Z is $\Delta Ta$ despite that reactive currents Ia and Iz are intended to be supplied to the motors A and Z, respectively, it is understood that the signal lines for motors A and Z have been transposed or miswired.

As above, when the initial temperatures of motors A, B, . . . , Z before supply of reactive current are represented as Ta1, Tb1, . . . , Tz1 and the temperature after supply of reactive current is represented as Ta2, Tb2, . . . , Tz2, it is possible to determine that no miswiring exists if all the following equations hold:

$$Ta2-Ta1=\Delta Ta$$

$$Tb2-Tb1=\Delta Tb$$

. . .

$$Tz2-Tz1=\Delta Tz.$$

On the other hand, when Ta2−Ta1=$\Delta Tz$, it is possible to determine that the motor control device A is miswired to the motor Z by a signal line.

Next, the method of detecting the presence or absence of miswiring using the motor control apparatus according to the third embodiment of the present invention will be described using a flow chart shown in FIG. 10.

First, at Step S401, the initial temperatures Ta1, Tb1, . . . , Tz1 of the motors A, B, . . . , Z are detected. Specifically, the miswiring detecting units 4A, 4B, . . . , 4Z acquire the detected values of the temperature of the motors A, B, . . . , Z, output from the motor temperature detectors 20A, 20B, . . . , 20Z before supply of reactive current, via wiring lines 30A, 30B, . . . , 30Z, respectively.

Next, at Step S402, reactive currents Ia, Ib, . . . , Iz, differing from each other, are supplied to the motors A, B, . . . , Z, respectively. Herein, it is assumed that the reactive currents are supplied via the power lines that connect between motors A, B, . . . , Z and motor control devices 103A, 103B, . . . , 103Z while the power lines are correctly connected.

Next, at Step S403, temperatures Ta2, Tb2, . . . , Tz2 after supply of reactive current to motors A, B, . . . , Z, are detected.

Next, at Step S404 it is determined whether the difference between Ta2 and Ta1 is equal to or not equal to ΔTa, the known temperature. When Ta2−Ta1=ΔTa does not hold, it is determined that miswiring exists at Step S408, and the sequential procedure is ended.

On the other hand, at Step S404, when Ta2−Ta1=ΔTa holds, it is determined that the signal line between the motor A and the motor control device A is correctly connected, and detection of miswiring of the motor B afterwards follows.

Next, at Steps S405 to S406, it is sequentially determined whether or not Tb2−Tb1=ΔTb, . . . , Tz2−Tz1=ΔTz hold. When a certain equation does not hold, it is determined that miswiring exists at Step S408, and the sequential procedure is ended. On the other hand, when all the equations for all the motors A to Z have held, it is determined that no miswiring exists.

Although the above description was given by taking an example in which it is determined whether miswiring exists or not at Step S408, it is possible to identify the miswiring places of wiring lines between motors and motor control devices, by comparing the temperature rise before and after supply of reactive current with the known value.

Further, the above description was given by taking an example in which the procedure is ended when a miswiring is detected at Step S408. However, not limited to this, it is also possible to identify the places of miswiring of all the motors by detecting the presence or absence of miswiring of the other motors after detection of a miswiring.

As described above, according to the motor control apparatus of the third embodiment of the present invention, it is possible to easily determine the existence of miswiring when multiple motors use identical detectors or at the time of tandem driving. Further, in a mechanical configuration that drives one axis by use of multiple motors, even if the rotor positions are in phase, it is possible to detect miswiring of signal lines based on reactive current commands to motors and temperature rises of motors without driving the motors. Further, supplying different levels of reactive current makes it possible to detect a multiple number of miswirings at the same time.

As has been described heretofore, according to the motor control apparatus of the embodiments of the present invention, it is possible to detect miswiring safely without rotating motors at the driving of the machine.

The invention claimed is:

1. A motor control apparatus configured to be connected to a motor by a wiring line, comprising:
    a motor driver for driving the motor based on current command supplied through the wiring line connected between the motor driver and the motor;
    a current commander for commanding supply of current including reactive current to the motor driver through the wiring line; and,
    a miswiring detector for detecting miswiring of the wiring lines connected to the motor by acquiring via the wiring line a signal indicating a motor temperature detected by a motor temperature detector provided for the motor,
    wherein the miswiring detector detects the presence or absence of miswiring of the wiring lines, based on the change of the motor temperature when the current commander commands to the motor driver supply of reactive current which is phase current that does not contribute to rotation of the motor.

2. The motor control apparatus according to claim 1, wherein the miswiring detector determines occurrence of miswiring when the difference between a motor temperature detected before the current commander commands supply of reactive current and a motor temperature detected after the current commander commands supply of reactive current is smaller than a first reference value.

3. The motor control apparatus according to claim 1, wherein the miswiring detector acquires information on a position detector temperature from a detector temperature-detecting unit that detects a temperature of a position detector of the motor, via the other wiring line, and
    wherein the miswiring detector detects presence or absence of miswiring based on the compared result between the detected motor temperature and the detected position detector temperature.

4. The motor control apparatus according to claim 3, wherein the miswiring detector determines occurrence of miswiring when the difference between the detected motor temperature and the detected position detector temperature is greater than a second reference value.

5. A motor control apparatus configured to be connected to n (n≥2) motors via wiring lines, comprising:
    n motor drivers for driving the respective n motors based on current command through the wiring lines connected between the motor drivers and the motors;
    n current commanders for commanding supply of current including reactive current to the n motor drivers through the wiring lines; and,
    miswiring detectors that respectively acquire motor temperature-indicating signals detected by n motor temperature detectors provided for each motor through wiring lines to detect miswiring of the wiring lines connected to the n motors,
    wherein when the m-th (m≤n) current commander commands to the m-th motor supply of reactive current which is phase current that does not contribute to rotation of the motor, the miswiring detectors detect presence or absence of miswiring based on the change of the motor temperature of the m-th motor.

6. The motor control apparatus according to claim 5, wherein the n current commanders each give a command of supplying a different amount of reactive current from each other, to the respective n motor drivers.

* * * * *